(12) United States Patent
Ngo et al.

(10) Patent No.: US 6,664,187 B1
(45) Date of Patent: Dec. 16, 2003

(54) LASER THERMAL ANNEALING FOR CU SEEDLAYER ENHANCEMENT

(75) Inventors: Minh Van Ngo, Fremont, CA (US); Minh Q. Tran, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/114,462

(22) Filed: Apr. 3, 2002

(51) Int. Cl.[7] ............... H01L 21/4763; H01L 21/44
(52) U.S. Cl. ............... 438/687; 438/627; 438/629; 438/638; 438/662
(58) Field of Search ............... 438/687, 627, 438/629, 638, 662, 643, 644, 663, 660, 678, 680, 783

(56) References Cited

U.S. PATENT DOCUMENTS

| | | | | |
|---|---|---|---|---|
| 3,950,187 A | * | 4/1976 | Kirpatrick | |
| 4,985,371 A | * | 1/1991 | Rana et al. | |
| 6,071,809 A | * | 6/2000 | Zhao | |
| 6,136,707 A | * | 10/2000 | Cohen | |
| 6,143,650 A | * | 11/2000 | Pramanick et al. | |

* cited by examiner

Primary Examiner—Ha Tran Nguyen

(57) ABSTRACT

Semiconductor devices with highly reliable Cu interconnects exhibiting reduced resistance are formed by sequentially depositing a seedlayer by PVD, depositing a conformal seedlayer enhancement film by CVD, and then laser thermal annealing the seedlayer enhancement film in nitrogen to expel impurities, enhance film conductivity, reduce film stress, increase film density, and reduce film roughness. Embodiments include single and dual Cu damascene techniques formed in dielectric layers having a dielectric constant no greater than about 3.9.

20 Claims, 11 Drawing Sheets

LASER THERMAL ANNEALING FOR CU SEEDLAYER ENHANCEMENT

TECHNICAL FIELD

The present invention relates to copper (Cu) and/or Cu alloy metallization in semiconductor devices, and to a method for manufacturing semiconductor devices with reliable, low resistance Cu or Cu alloy interconnects. The present invention is particularly applicable to manufacturing high speed integrated circuits having submicron design features and high conductivity interconnect structures.

BACKGROUND ART

The escalating demand for high density and performance impose severe requirements on semiconductor fabrication technology, particularly interconnection technology in terms of providing reliable low R×C (resistance×capacitance) interconnect patterns with higher electromigration resistance, wherein submicron vias, contacts and trenches have high aspect ratios.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-a-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti-TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

In implementing Cu metallization, particularly in damascene techniques wherein an opening is formed in a dielectric layer, particularly a dielectric layer having a low dielectric constant, e.g., a dielectric constant less than about 3.9, various reliability, electromigration and resistance issues are generated. Reliability issues stem, in part, from the difficulty in forming a continuous seedlayer on a barrier layer in an opening, particularly as the feature sizes continue to shrink into the deep submicron regime. For example, an opening is formed in dielectric layer 10, as illustrated in FIG. 1. A seedlayer for deposition of Cu 12 is then deposited by physical vapor deposition (PVD). As a result of reduced feature sizes and high aspect ratios, it is extremely difficult to deposit a continuous seedlayer lining the opening. Consequently, discontinuities in seedlayer 12 form, as illustrated by reference numeral 13. In addition, it is even difficult to effectively plate the seedlayer 12 on the bottom of the opening. Cu cannot be electroplated on a discontinuous seedlayer or where no seedlayer exists. Consequently, voids are induced leading to high resistance vias and lines or opening circuits.

Accordingly, there exists a need for methodology enabling the formation of reliable Cu interconnects with reduced resistivity and reduced voids.

DISCLOSURE OF THE INVENTION

An advantage of the present invention is a method of manufacturing a semiconductor device having reliable, low resistance Cu or Cu alloy interconnects with significantly reduced voids.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening in a dielectric layer; depositing a barrier layer lining the opening; depositing a seedlayer for copper (Cu) or Cu alloy deposition on the barrier layer; depositing a seedlayer enhancement film by chemical vapor deposition on the seedlayer; laser thermal annealing the seedlayer enhancement film; and filling the opening with Cu or a Cu alloy.

Embodiments include forming a dual damascene opening in dielectric material having a dielectric constant no greater than about 3.9, such as a fluorine (F)-containing oxides, such as an F-containing oxide derived from tetraethyl orthosilicate (TEOS), the opening comprising an upper trench section in communication with a lower via hole section; depositing a composite barrier layer lining the opening, the composite barrier layer comprising a layer of tantalum nitride and a layer of α-tantalum thereon; depositing a seedlayer by PVD on the α-tantalum layer, the deposited seedlayer having discontinuities, depositing a conformal seedlayer enhancement film by chemical vapor deposition bridging discontinuities in the seedlayer and having a rough surface; laser thermal annealing the seedlayer enhancement film in flowing nitrogen to reduce the roughness of the seedlayer enhancement film; and filling the opening with Cu or a Cu alloy to form a Cu or Cu alloy line in communication with an underlying Cu or Cu alloy via. Embodiments of the present invention include laser thermal annealing by impinging a pulsed laser light beam on the rough exterior surface of the deposited seedlayer enhancement film at a radiant fluence of about 0.084 to about 0.136 joules/cm$^2$ for about 10 to about 100 nanoseconds, thereby elevating the temperature of the seedlayer enhancement film to about 300° C. to about 500° C.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

The present invention addresses and solves various problems attendant upon forming metallized interconnects, such as Cu or Cu alloy interconnects, particularly, damascene structures in dielectric layer(s) having a dielectric constant less than about 3.9, such as F-containing dielectric material, e.g., F-containing silicon oxide derived from TEOS(F-TEOS). As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

Figure 1:
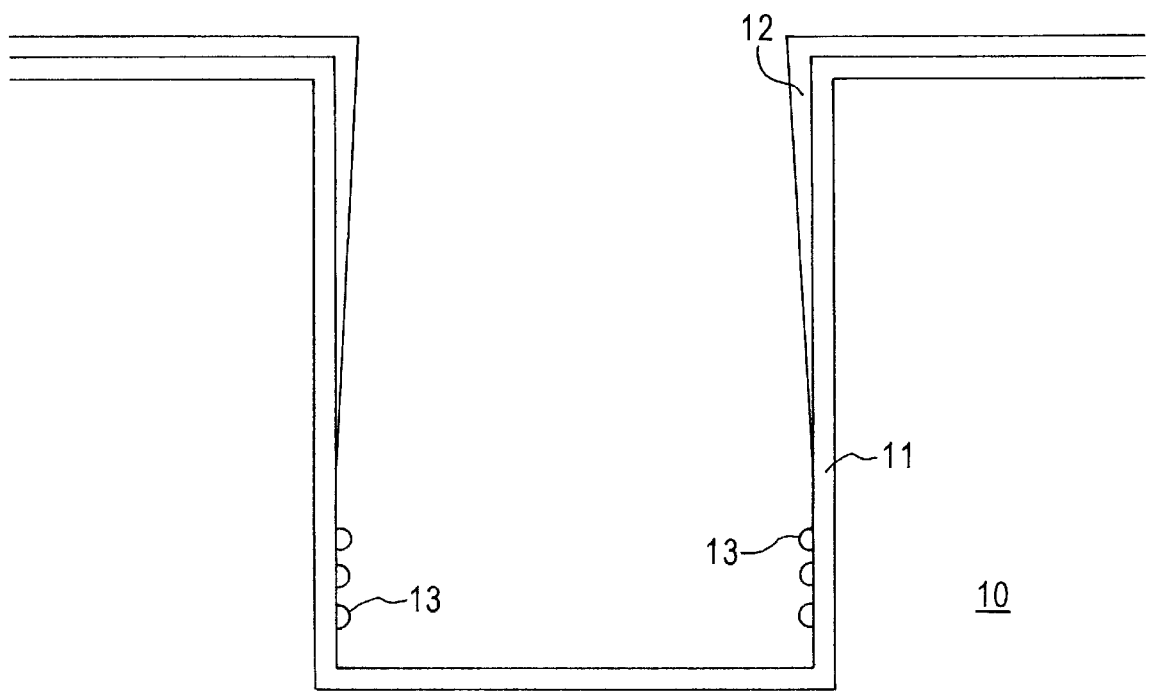
FIG. 1 schematically illustrates a discontinuous seedlayer of problem solved by the present invention.
Figure 2:
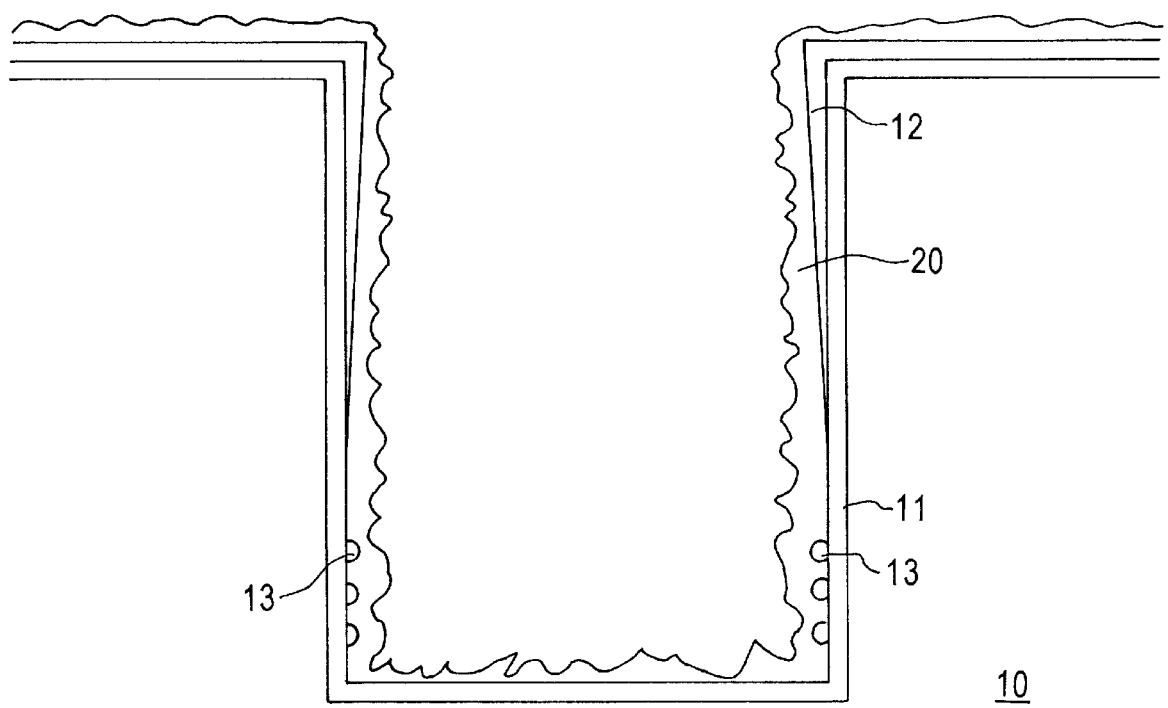
FIGS. 2 through 5 schematically illustrate sequential phases of a method in accordance with an embodiment of the present invention.

As design rules are scaled down into the deep submicron range, such as about 0.12 micron and under, reliability and contact resistance issues associated with interconnects, particularly Cu interconnects, become increasingly significant. Reliability and contact resistance issues stem, in part, from the inability to deposit a continuous seedlayer for Cu deposition, particularly as the dimensions shrinking into the sub-micron regimes and aspect ratios increase to over 4.5. As shown in FIG. 1, the deposition of a seedlayer 12 by PVD results in discontinuities 13 and the absence of a seedlayer at the bottom of the opening. Upon subsequent electroplating Cu, voids are formed leading to high resistance vias and lines or open circuits. In attempting to address this problem, a seedlayer enhancement film was deposited, using a seedlayer for Cu deposition, by chemical vapor deposition (CVD). Such a seedlayer enhancement film is schematically illustrated in FIG. 2 by reference numeral 20. However, it was found that such a seedlayer enhancement film disadvantageously exhibits extremely poor properties, and contains high impurity concentrations, such as carbon, oxygen and hydrogen. As a result, the subsequently deposited electroplated Cu film exhibits high resistivity, high surface roughness, voids and a small grain size, leading to significantly increased via/line resistance and lower circuit speed, in addition to generating electromigration and other reliability issues.

In accordance with embodiments of the present invention, the inadequacies of the seedlayer and seedlayer enhancement film are addressed by strategically treating the exposed rough surface of seedlayer enhancement film by laser thermal annealing to improve its properties for subsequent Cu electroplating. In accordance with embodiments of the present invention, the rough surface of the conformal seedlayer enhancement film is subjected to a pulsed laser light beam in nitrogen, such as at a flow rate of about 200 to 2,000 sccm, for a period of time of about 10 to about 100 nanoseconds. During such laser thermal annealing, the temperature of the seedlayer enhancement film is elevated to a temperature of about 300° C. to about 500° C. Such laser thermal annealing improves the quality of the seedlayer enhancement film by driving out impurities, enhancing film conductivity, reducing film stress, densifying the film and significantly reducing film roughness. The removal of impurities during laser thermal annealing advantageously prevents subsequent out-gassing and, hence, reduces voiding. An additional benefit of laser thermal annealing comprises thinning the seedlayer enhancement film at the bottom portion of the via and reduced overhang of the conformal seedlayer enhancement film, thereby insuring complete filling of openings with reduced voiding.

Figure 3:
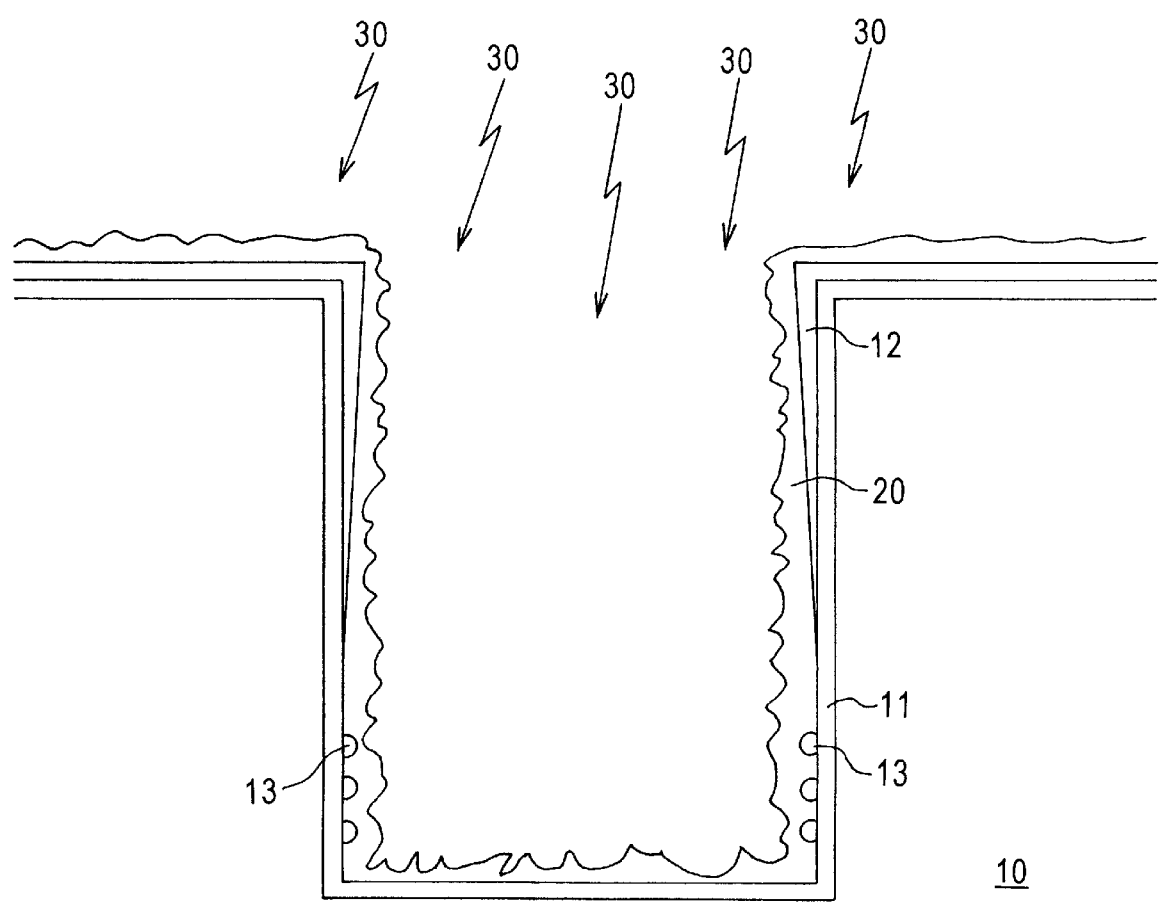
Figure 4:
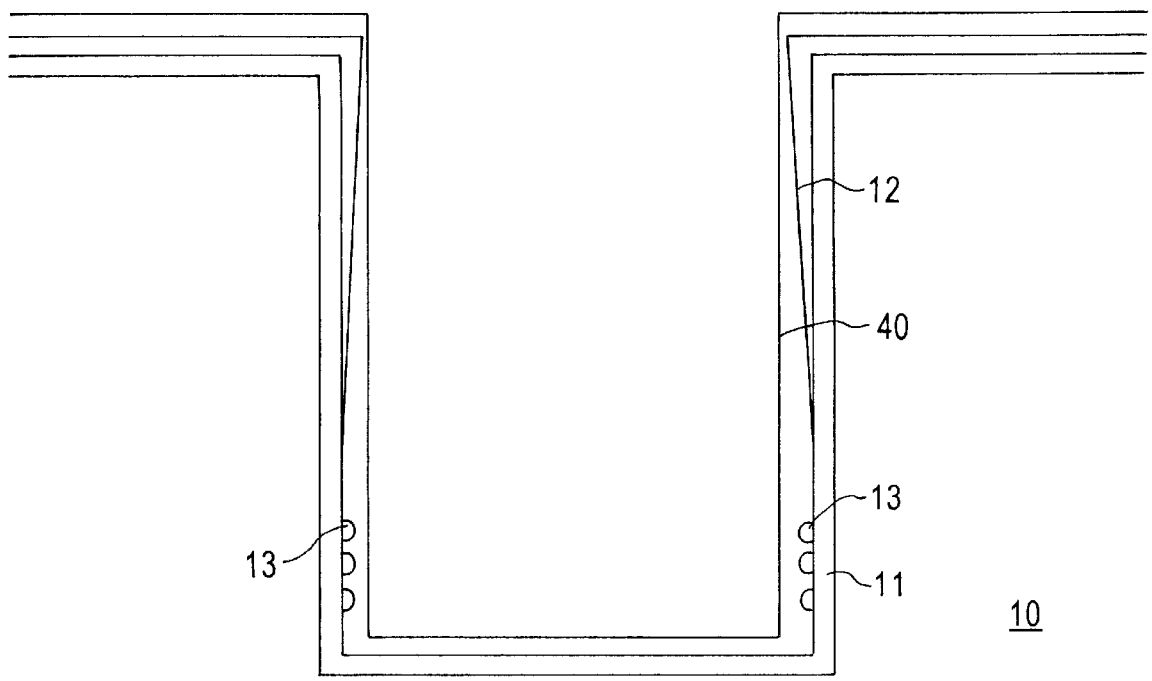

As schematically illustrated in FIG. 3, the seedlayer enhancement film 20 is subjected to laser thermal annealing, as schematically illustrated by arrows 30, in nitrogen flowing at about rate of 200 to about 2,000 sccm. Laser thermal annealing alters the seedlayer enhancement film 20, resulting in the modified seedlayer enhancement film 40 illustrated in FIG. 4. The improved seedlayer enhancement film 40 exhibits a smooth surface and is thinned somewhat at the bottom and corners, thereby reducing contact resistance and improving filling. Laser thermal annealing reduces or drives out impurities, such as carbon, oxygen and hydrogen, thereby preventing subsequent voiding in the deposited Cu.

Figure 5:
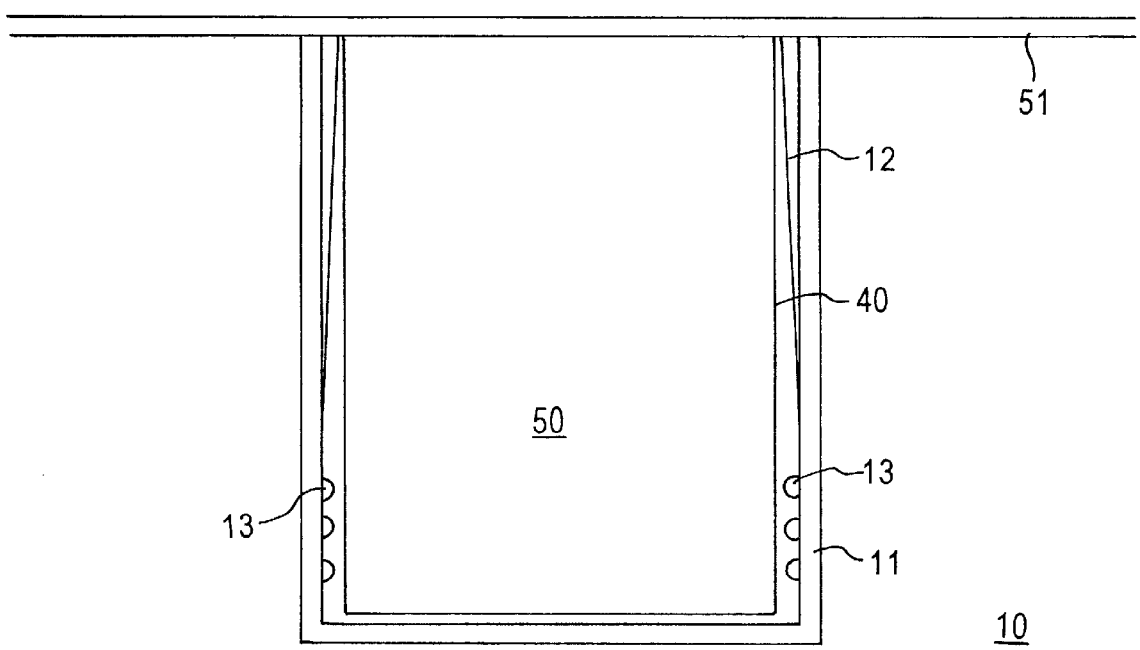
Figure 6:
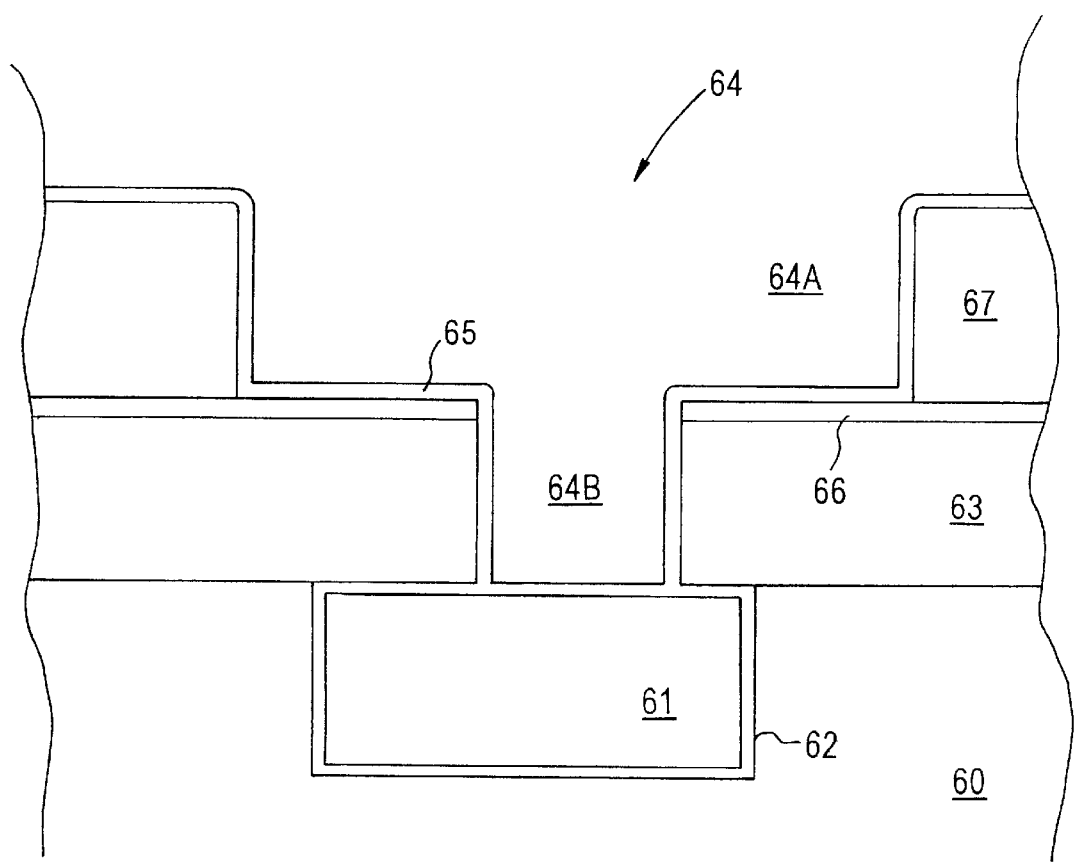
FIGS. 6 through 11 schematically illustrate sequential phases of a method in accordance with another embodiment of the present invention.

Subsequent processing includes electroplating copper 50 to fill the opening as shown in FIG. 5, chemical mechanical polishing (CMP) to reduce any overburden on the upper surface of dielectric layer 10 and depositing capping layer 51, such as silicon nitride or silicon carbide.

Another embodiment of the present invention is schematically illustrated in FIGS. 6 through 11, wherein similar features are denoted by similar reference numerals. Adverting to FIG. 6, a lower metal feature 61, such as a Cu line, is formed in an underlying dielectric layer 60, with a barrier layer 62 encapsulating metal feature 61. Dielectric layers 63 and 67 are deposited with a middle etch stop layer 66 therebetween. Dielectric layers 63 and 67 can comprise any of various dielectric materials conventionally employed and fabricating semiconductor devices, particularly low-k dielectric materials having a dielectric constant (k) no greater than about 3.9, such as F-TEOS. Middle etch stop layer 66 can comprise silicon nitride, silicon oxynitride or silicon carbide. A dual damascene opening 64 is then formed comprising upper trench 64A and lower via hole section 64B. Dual damascene opening 64 can be formed in a conventional manner, as by a conventional via first-trench last technique or a conventional trench first-via last technique. A barrier layer 65 is then deposited, such as a composite barrier layer comprising an initial layer of tantalum nitride and a layer of α-tantalum thereon. Composite barrier layer 65 can be formed at a combined thickness of about 50 Å to about 300 Å, as by physical vapor deposition (PVD) techniques, such as ionized physical vapor deposition (IPVD), e.g., ionized sputtered deposition (ISD).

Figure 7:
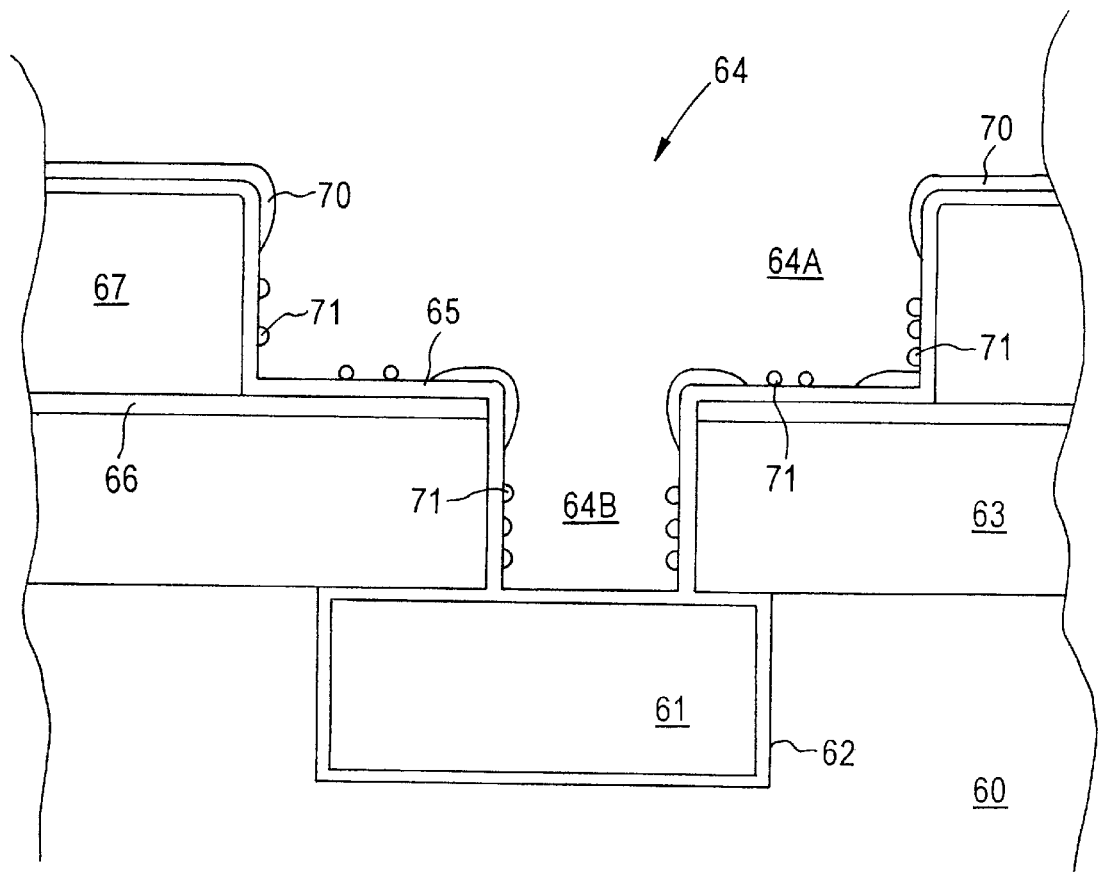

Subsequently, as schematically illustrated in FIG. 7, a seedlayer 70 is deposited by PVD. Seedlayer 70 is typically discontinuously formed, as illustrated by islands 70 and the absence of any seedlayer at the bottom of via hole section 64B. Seedlayer 70 may be formed at a thickness of about 200 Å to about 300 Å and may comprise a conventional seedlayer material for Cu deposition, such as Cu itself or a Cu alloy containing magnesium, aluminum, zinc, zirconium, tin, nickel, palladium, silver or gold in a suitable amount, e.g., about 0.3 to about 12 at. %.

Figure 8:
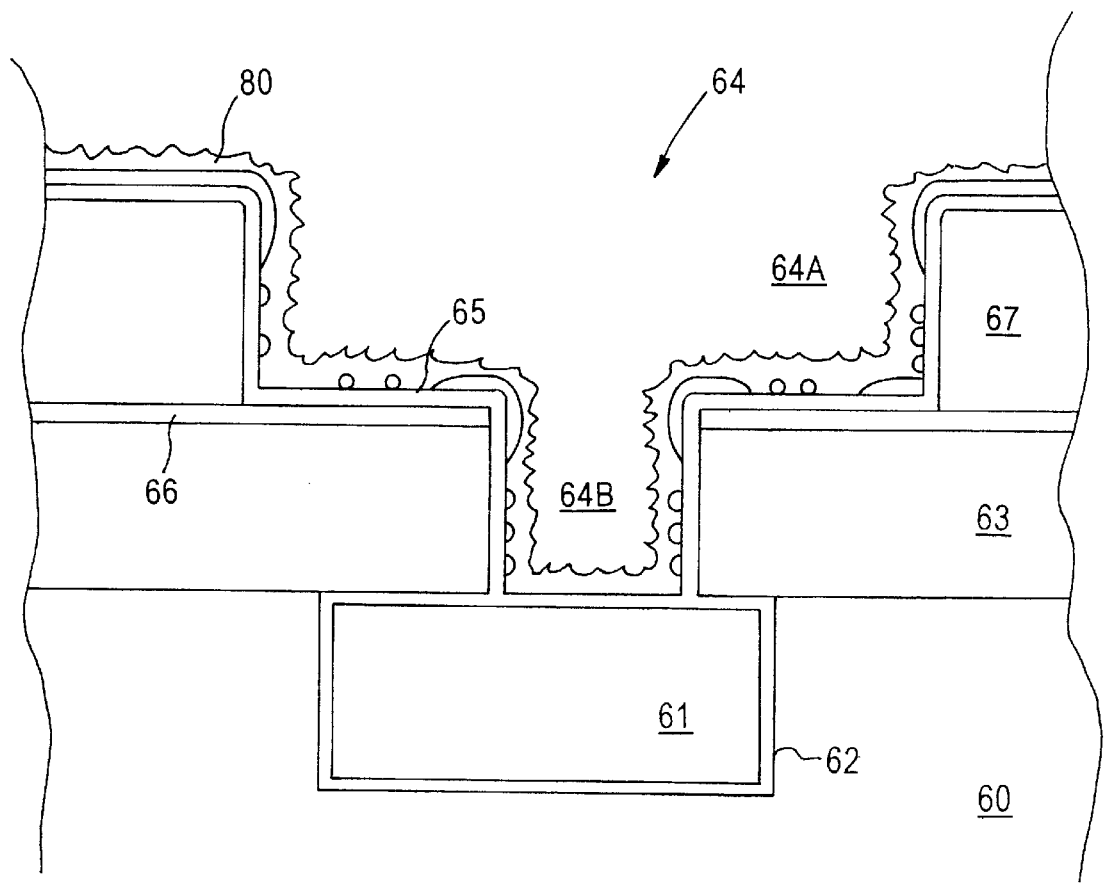
Figure 9:
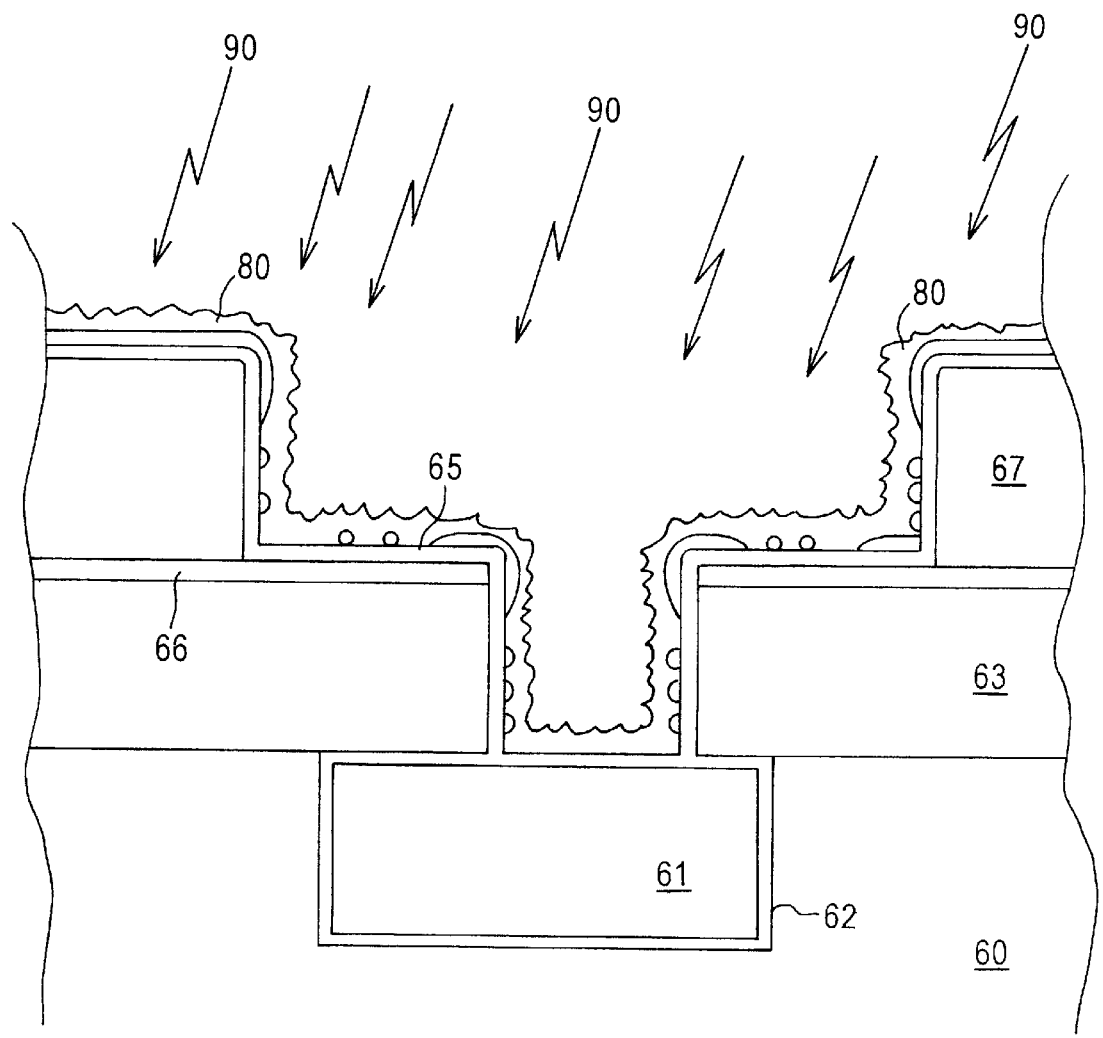
Figure 10:
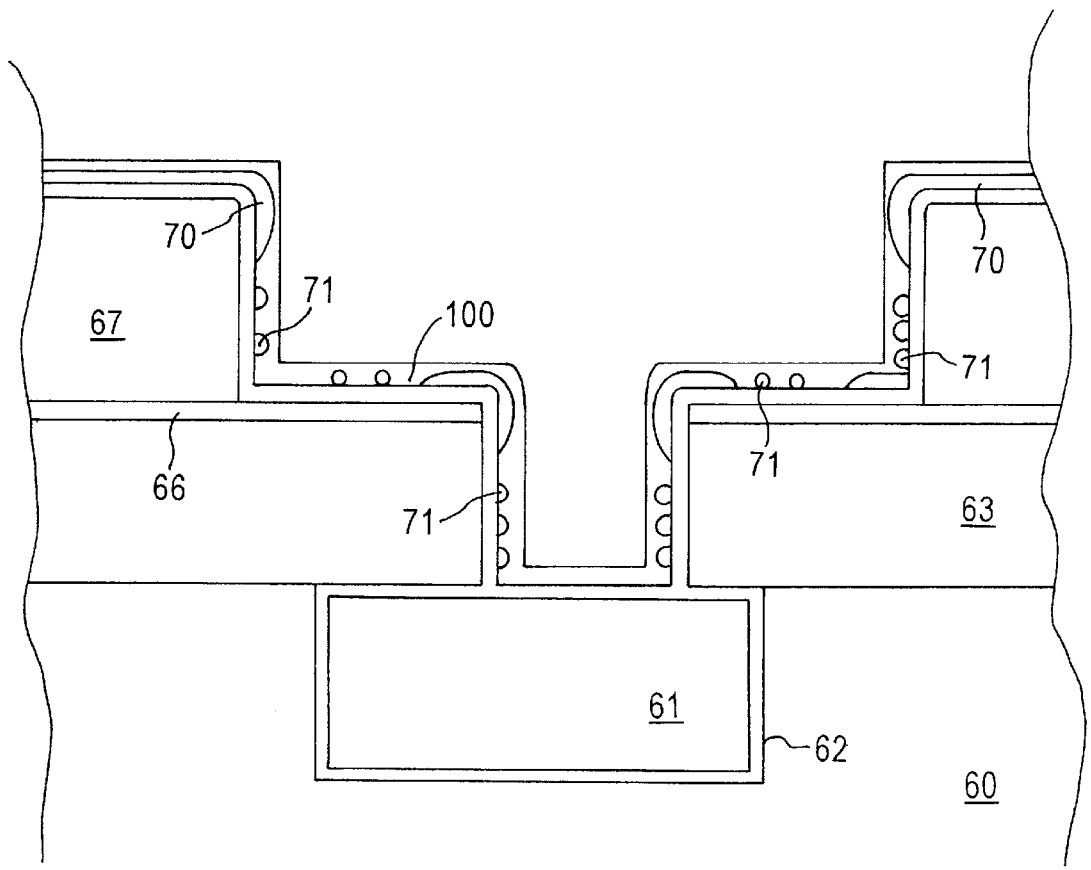

Subsequently, as schematically illustrated in FIG. 8, a seedlayer enhancement film 80 is deposited by CVD, typically at a thickness of about 300 Å to about 400 Å. Seedlayer enhancement film 80 is conformal and typically exhibits a rough surface and contains impurities which would out-gas subsequent Cu deposition causing undesirable voids and increased resistance. In accordance with embodiments of the present invention, as shown in FIG. 9, the seedlayer enhancement film 80 is subjected to laser thermal annealing, as schematically illustrated by arrows 90, by impinging a pulsed laser light beam on the exposed rough surface of seedlayer enhancement film 80, as at a radiance fluence of about 0.084 to about 0.136 joules/cm$^2$, for about 10 to about 100 nanoseconds, thereby elevating the temperature of the seedlayer enhancement film 80 to about 300° C. to about 500° C. During such laser thermal annealing, impurities, such as carbon, oxygen and hydrogen in the seedlayer enhancement film 80 are driven out and the surface of seedlayer enhancement film 80 significantly reduced in roughness. Laser thermal annealing also reduces film stress and increases the density of the film. The resulting structure is schematically illustrated in FIG. 10 having improved seedlayer enhancement film 100 with a smooth surface.

Figure 11:
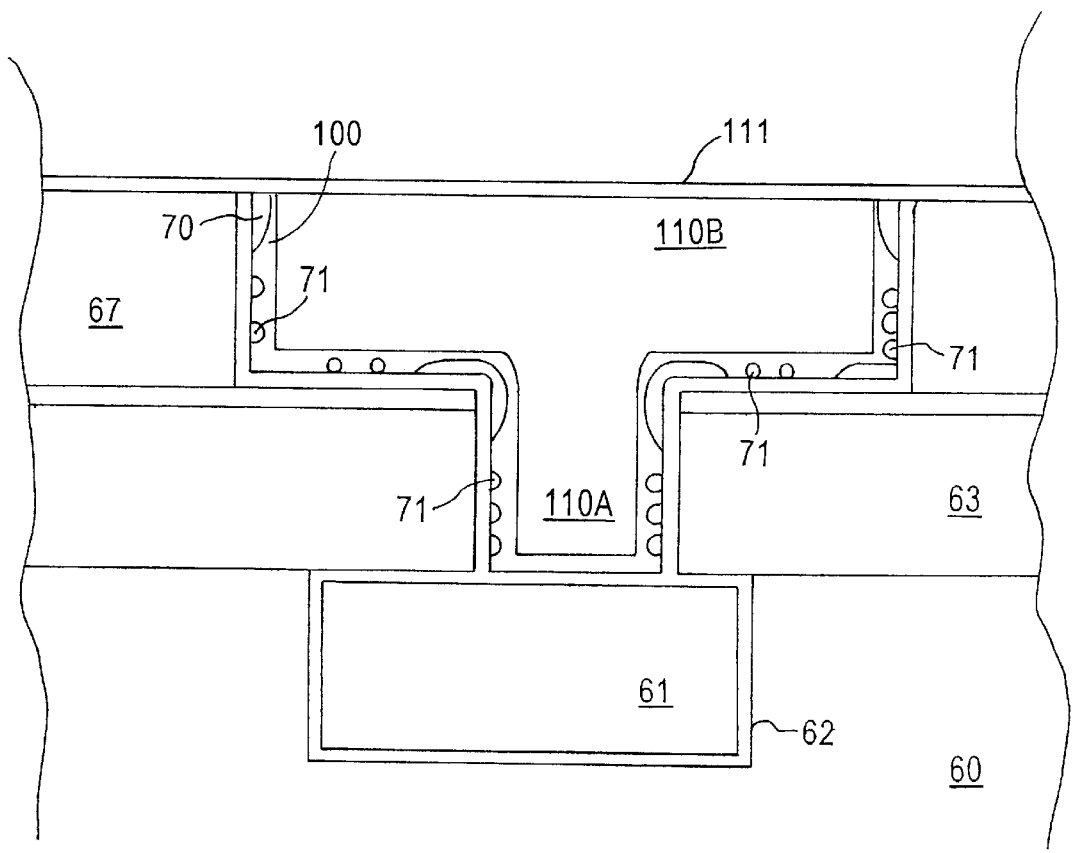

Subsequently, as schematically illustrated in FIG. 11, Cu is deposited, as by electroplating, to form dual damascene structure comprising upper Cu line 100B in communication with lower Cu via 110A. CMP is then conducted to remove any overburden and a capping layer 111 is deposited, such as silicon nitride or silicon carbide.

The present invention advantageously enables fabricating semiconductor devices having submicron features with highly reliable Cu interconnects exhibiting significantly reduced voiding and reduced contact resistance. Problems attendant upon inadequate seedlayer deposition and poor seedlayer enhancement film formation are addressed and solved by implementing laser thermal annealing to smooth the roughen surface of the seedlayer enhancement film and drive out impurities, thereby enabling filling of the opening, particularly a dual damascene opening formed in low dielectric constant materials, with improved reliability reduced voiding and reduced contact resistance.

The use of laser thermal annealing advantageously enables pinpoint targeting of the exposed surfaces of the seedlayer enhancement film for a relatively short period of time without unnecessarily heating different areas of the wafer, thereby avoiding various adverse consequences, such as problematic dopant diffusion issues. In implementing embodiments of the present invention, any of various conventional laser systems can be employed, such as an excimer or Nd-YAG pulse laser. Commercially available laser tools for laser annealing, either with or without a mask, are available, such the Verdant Technologies laser anneal tool operating at an exposure wavelength of 308 nm. Available laser sources are capable of operating at energies of from about 10 to about 2,000 mj/cm$^2$/pulse. Suitable operating conditions can be determined in a particular situation.

In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron-and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include FO$_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

The present invention enjoys industrial applicability in fabricating various types of semiconductor devices comprising interconnects, particularly inlaid Cu metallization interconnection patterns. The present invention enjoys particularly industrial applicability in fabricating semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising:
    forming an opening in a dielectric layer;
    depositing a barrier layer lining the opening;
    depositing a seedlayer for copper (Cu) or Cu alloy deposition on the barrier layer;
    depositing a seedlayer enhancement film by chemical vapor deposition on the seedlayer;
    laser thermal annealing the seedlayer enhancement film; and
    filling the opening with Cu or Cu alloy.

2. The method according to claim 1, comprising depositing the seedlayer by physical vapor deposition, wherein the deposited seedlayer exhibits discontinuities.

3. The method according to claim 2, wherein the seedlayer comprises Cu or Cu alloy containing an alloying element selected from the group consisting of magnesium, aluminum, zinc, zirconium, tin, palladium, silver and gold.

4. The method according to claim 2, comprising depositing the seedlayer at a thickness of about 200 Å to about 300 Å.

5. The method according to claim 2, comprising depositing the seedlayer enhancement film as a conformal film bridging the discontinuities in the seedlayer.

6. The method according to claim 5, comprising depositing the seedlayer enhancement film at a thickness of about 300 Å to about 400 Å.

7. The method according to claim 5, wherein the seedlayer comprises Cu or Cu alloy containing an alloying element selected from the group consisting of magnesium, aluminum, zinc, zirconium, tin, palladium, silver and gold.

8. The method according to claim 1, comprising laser thermal annealing by impinging a pulsed laser light beam on exposed surfaces of the seedlayer enhancement film at a radiant fluence of about 0.084 to about 0.136 joules/cm$^2$.

9. The method according to claim 8, comprising laser thermal annealing in nitrogen.

10. The method according to claim 9, comprising laser thermal annealing at a nitrogen flow rate of 200 to 2,000 sccm.

11. The method according to claim 9, comprising laser thermal annealing for 10 to 100 nanoseconds.

12. The method according to claim 9, comprising laser thermal annealing to elevate the temperature of the seedlayer enhancement film to 300° C. to 500° C.

13. The method according to claim 1, comprising depositing a composite barrier layer comprising a layer tantalum nitride lining the opening and a layer of α-tantalum on the tantalum nitride layer.

14. The method according to claim 13, comprising depositing the composite barrier layer at a combined thickness of 50 Å to 300 Å.

15. The method according to claim 1, wherein the opening comprises a dual damascene opening having a lower via hole section in communication with an upper trench section, the method comprising filling the opening with Cu or Cu alloy to form a lower via in communication with an upper line.

16. The method according to claim 15, wherein the dual damascene opening is formed dielectric material having a dielectric constant no greater than about 3.9.

17. The method according to claim 15, wherein the dual damascene opening is formed in dielectric material comprising a fluorine (F)-containing oxide.

18. The method according to claim 5, wherein the deposited seedlayer enhancement film exhibits a rough surface, the method comprising laser thermal annealing to reduce the roughness of the seedlayer enhancement film.

19. A method of manufacturing a semiconductor device, comprising:
    forming a dual damascene opening having a lower via hole section in communication with an upper trench section in dielectric material having a dielectric constant no greater than about 3.9;
    depositing a composite barrier layer comprising a layer tantalum nitride and a layer of α-tantalum thereon lining the opening;
    depositing a seedlayer for copper (Cu) or Cu alloy deposition on the α-Ta layer of the composite barrier layer by physical vapor deposition, wherein the deposited seedlayer exhibits discontinuities;
    depositing a conformal seedlayer enhancement film by chemical vapor deposition on the seedlayer bridging the discontinuities wherein the seedlayer enhancement film exhibits surface roughness;
    laser thermal annealing the seedlayer enhancement film in flowing nitrogen to reduce the roughness of the seedlyer enhancement film; and
    filling the opening with a Cu or Cu alloy to form a line in communication with an underlying via.

20. The method according to claim 19, wherein each of the seedlayer and seedlayer enhancement film comprises Cu or Cu alloy containing an alloying element selected from the group consisting of magnesium, aluminum, zinc, zirconium, tin, palladium, silver and gold.

* * * * *